(12) United States Patent
Kim et al.

(10) Patent No.: US 7,960,822 B2
(45) Date of Patent: Jun. 14, 2011

(54) PACKAGE ON PACKAGE SUBSTRATE

(75) Inventors: Yoon-Hee Kim, Chungcheongnam-do (KR); Tae-Hyeog Kang, Cheongju-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/506,593

(22) Filed: Jul. 21, 2009

(65) Prior Publication Data

US 2010/0123235 A1    May 20, 2010

(30) Foreign Application Priority Data

Nov. 17, 2008  (KR) .................. 10-2008-0113850

(51) Int. Cl.
*H01L 23/02* (2006.01)
(52) U.S. Cl. ............... 257/686; 257/777; 257/E23.141
(58) Field of Classification Search .............. 257/777, 257/779, 781, 736, 686
See application file for complete search history.

(56) References Cited

U.S. PATENT DOCUMENTS

| 7,253,510 B2 * | 8/2007 | Harvey ................ 257/686 |
| 2003/0197260 A1 * | 10/2003 | Nishimura et al. ........... 257/686 |
| 2008/0265391 A1 * | 10/2008 | Sterrett et al. ............ 257/686 |

FOREIGN PATENT DOCUMENTS

| KR | 1999-002343 A | 1/1999 |
| KR | 10-0746362 B | 7/2007 |
| KR | 10-0803960 B | 2/2008 |

OTHER PUBLICATIONS

Korean Office Action issued in Korean Patent Application No. KR 10-2008-0113850 dated Apr. 30, 2010.

* cited by examiner

*Primary Examiner* — Chuong A Luu
*Assistant Examiner* — Nga Doan
(74) *Attorney, Agent, or Firm* — McDermott Will & Emery LLP

(57) ABSTRACT

A package on package substrate is disclosed. The package on package substrate in accordance with an embodiment of the present invention can include a bottom package substrate, on which and an electronic element is mounted and of which an upper surface is formed with a bottom pad part and a solder resist part corresponding to the bottom pad part, and a top package substrate, which is stacked on an upper side of the bottom package substrate by interposing a solder between the top package substrate and the bottom package substrate and of which a lower surface is formed with a top pad part corresponding to the bottom pad part. The solder resist part can include a first solder resist layer, which is formed on the upper surface of the bottom package substrate, corresponding to the bottom pad part, and a second solder resist layer, which is formed on the first solder resist layer such that the bottom pad part is exposed.

7 Claims, 13 Drawing Sheets

PACKAGE ON PACKAGE SUBSTRATE

CROSS-REFERENCE TO RELATED APPLICATIONS

This application claims the benefit of Korean Patent Application No. 10-2008-0113850, filed with the Korean Intellectual Property Office on Nov. 17, 2008, the disclosure of which is incorporated herein by reference in its entirety.

BACKGROUND

1. Technical Field

The present invention relates to a package on package substrate.

2. Description of the Related Art

With the development of electronic industries, there are rapidly increasing demands for compact, multi-functional electronic parts. While a single electronic element has been mounted on the conventionally printed circuit board, the new stack package substrate has a plurality of electronic elements mounted on one substrate.

The system in package (SiP) has been created in the evolution of designing a package substrate to satisfy the demands for the compact, multi-functional electronic parts. The SiP is being further developed to various types, such as the package in package (PiP) and the package on package (PoP).

With an increasing number of studies and growing demands for high-performance, high-integration package substrate, the PoP, which stacks a package substrate on a package substrate, has become accepted as an alternative choice.

An important design factor of implementing a PoP is the overall thickness of a package. Although there has been an attempt to stack and mount two or more integrated circuits on a bottom package to improve the performance of the PoP, the increased overall thickness of the package hindered the implementation of the PoP.

The conventional PoP has been structured by stacking 1 to 4 integrated circuits on a top package to form a package and mounting one integrated circuit on a bottom package by wirebonding and then stacking the top package on the bottom package.

However, with the increasing density in the package, there have been demands for a multi-stack structure, in which 4 or more integrated circuits are stacked on a top package and 2 or more integrated circuits are stacked on a bottom package. This causes an increase in the overall thickness of the PoP and especially requires an increase in the distance between the top package and the bottom package.

Moreover, as the number of mounted integrated circuits is increased, the number of I/O connection terminals is also increased. Accordingly, there have been growing demands for a fine pitch bump.

In order to increase the distance between the top package and the bottom package, it is required to increase the size of a solder ball adhered to a lower side of the top package. However, this contradicts the demand for the aforementioned fine pitch.

Consequently, the conventional PoP technology has not been able to achieve a sufficient distance between packages to stack two or more integrated circuits on the bottom package corresponding to the thickness of the integrated circuits and simultaneously form a fine pitch.

SUMMARY

The present invention provides a package on package substrate that can adjust the distance between a top package and a bottom package as desired, increase the number of electronic elements capable of being mounted on the bottom package, and prevent a defect generated by an overflowed underfill solution or molding solution.

An aspect of present invention features a package on package substrate. The package on package substrate in accordance with an embodiment of the present invention can include a bottom package substrate, on which and an electronic element is mounted and of which an upper surface is formed with a bottom pad part and a solder resist part corresponding to the bottom pad part, and a top package substrate, which is stacked on an upper side of the bottom package substrate by interposing a solder between the top package substrate and the bottom package substrate and of which a lower surface is formed with a top pad part corresponding to the bottom pad part. The solder resist part can include a first solder resist layer, which is formed on the upper surface of the bottom package substrate, corresponding to the bottom pad part, and a second solder resist layer, which is formed on the first solder resist layer such that the bottom pad part is exposed.

The second solder resist layer can be shaped like a dam that envelops the electronic element, and the bottom pad part can include a first pad, which is formed on the upper surface of the bottom package substrate, and a second pad, which is formed on an upper surface of the first pad such that the second pad makes contact with the solder.

The second pad can be formed by electroplating the first pad, and a stepped difference can be formed between the second pad and the second solder resist layer.

The top pad part can include a third pad, which is formed on the lower surface of the top package substrate, and a fourth pad, which is formed on a lower surface of the third pad such that the fourth pad makes contact with the solder. A third solder resist layer can be formed on a surface of the top package substrate, corresponding to the third pad; and a fourth solder resist layer can be formed on the third solder resist layer such that the fourth pad is exposed. A stepped difference can be formed between the fourth pad and the fourth solder resist layer.

There can be a plurality of electronic elements, and the plurality of electronic elements can be vertically stacked.

DETAIL DESCRIPTION

Figure 1:
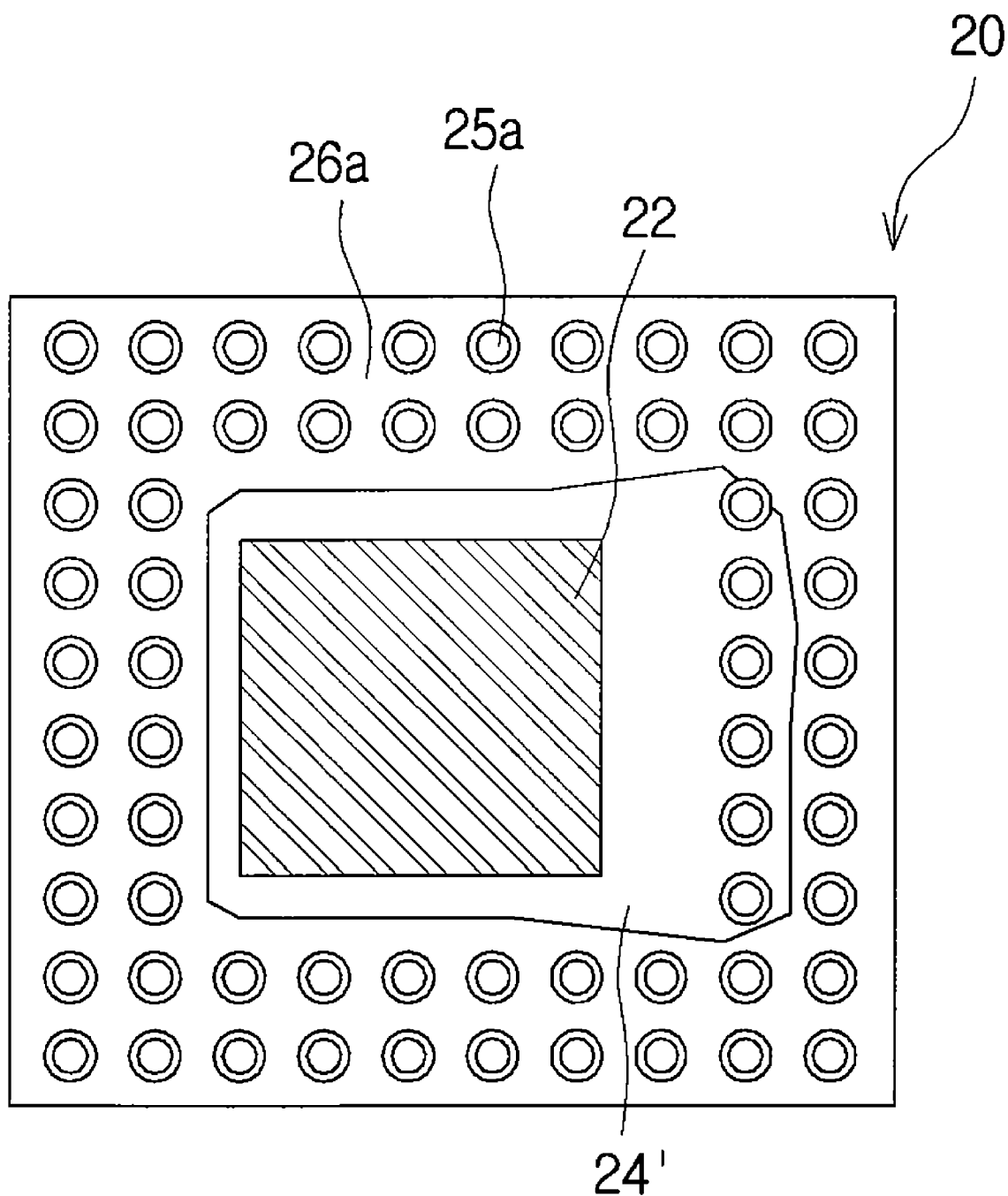
FIG. 1 is a plan view showing a bottom package substrate of a package on package substrate in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

When one element is described as being "connected" or "accessed" to another element, it shall be construed as being connected or accessed to another element directly but also as possibly having yet another element in between.

Hereinafter, a package on package substrate according to an embodiment of the present invention will be described in detail with reference to the accompanying drawings. Identical or corresponding elements will be given the same reference numerals, regardless of the figure number, and any redundant description of the identical or corresponding elements will not be repeated.

The increased number of electronic elements mounted on a bottom package substrate increases the distance between a top package substrate and a bottom package substrate. This causes an increase in the size of a solder ball for connecting the top package substrate and the bottom package substrate. The increased size of the solder ball may widen the distance between the package substrates. However, as more electronic elements are mounted, the number of connecting ports that are formed on the package substrate also increases, and as a result, this may conflictingly require connecting ports that have finer pitch distances.

In addition, when a bottom package substrate of a package on package substrate is manufactured, an underfill solution or molding solution may be overflowed to other adjacent units, thereby causing a defect in the pertinent units, in the underfill or molding process of a unit on which an electric element is mounted.

In accordance with an embodiment of the present invention, it is possible to suggest the structure of dividing a solder resist layer into a first solder resist layer and a second solder layer and also dividing a pad part into a first pad and a second pad, which will be described below, to solve the aforementioned overflowing problem and also to provide a space between the top package substrate and the bottom package substrate.

Figure 2:
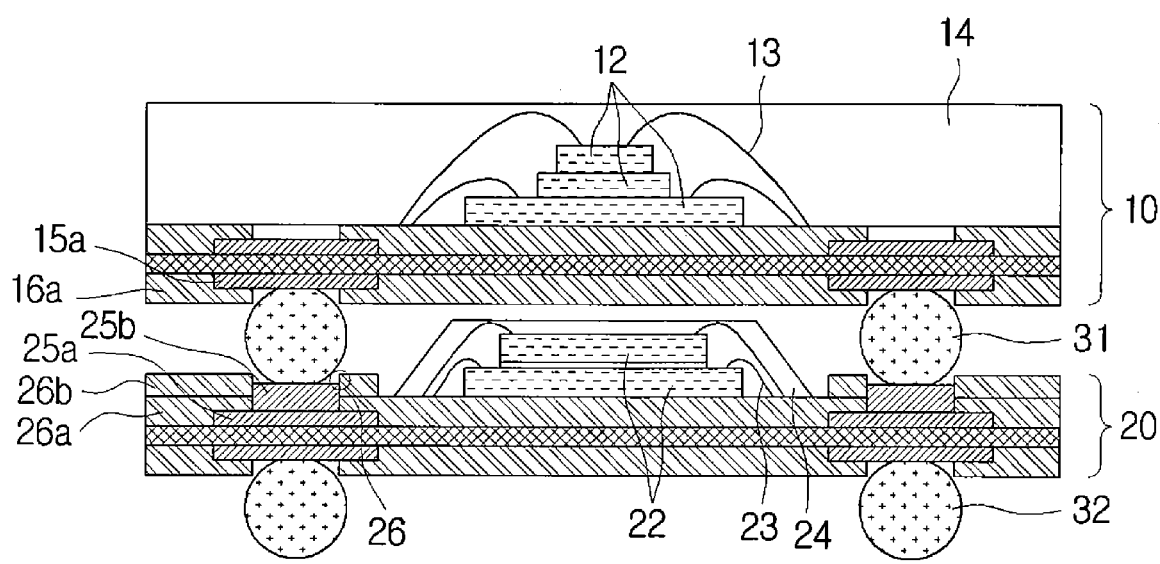
FIG. 2 is a cross-sectional view showing a package on package substrate in accordance with another embodiment of the present invention.
Figure 3:
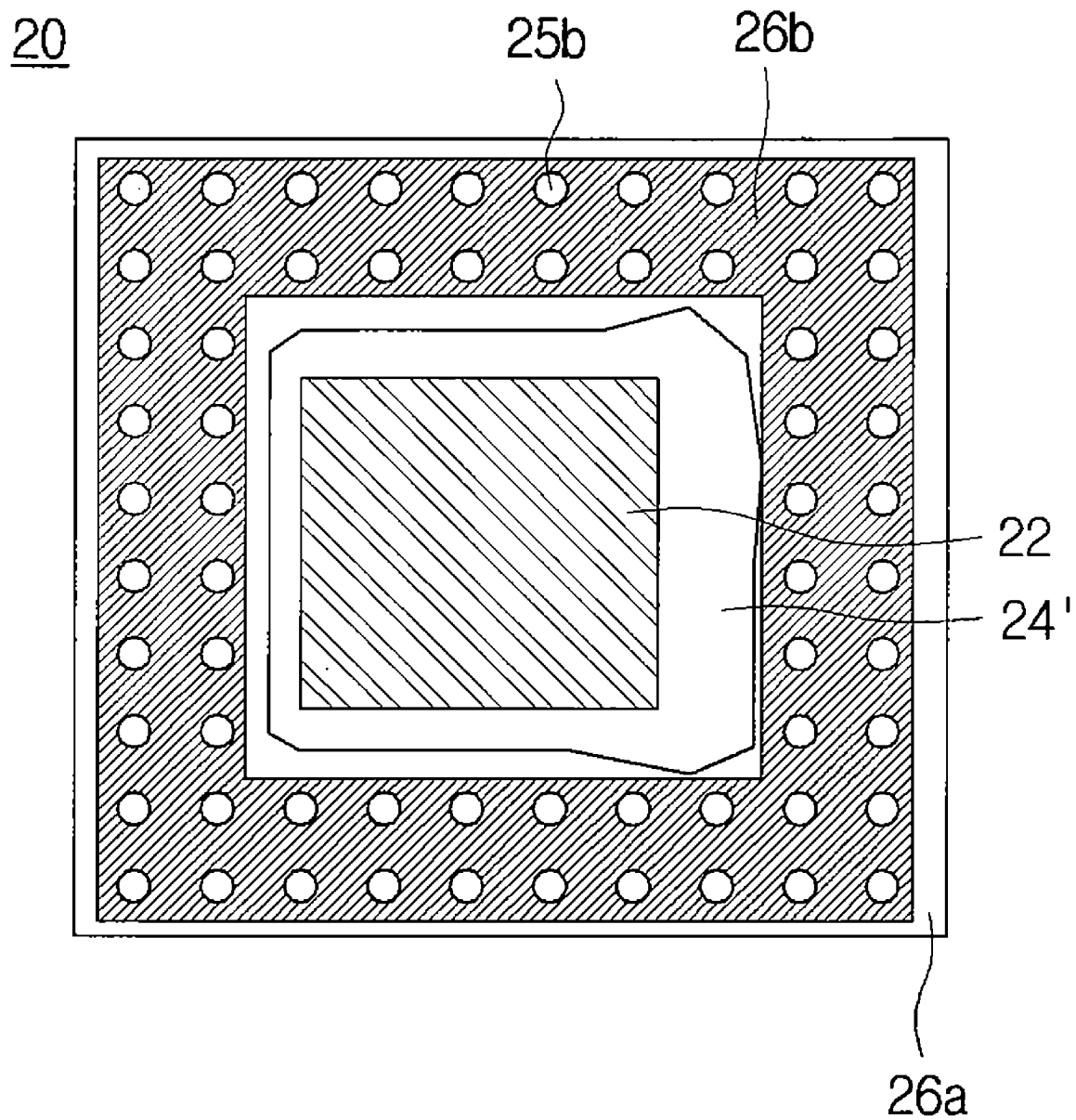
FIG. 3 is a plan view showing a bottom package substrate of a package on package substrate in accordance with another embodiment of the present invention.

FIG. 1 is a plan view showing a bottom package substrate of a package on package substrate in accordance with an embodiment of the present invention, and FIG. 2 is a cross-sectional view showing a package on package substrate in accordance with another embodiment of the present invention. FIG. 3 is a plan view showing a bottom package substrate of a package on package substrate in accordance with another embodiment of the present invention, and FIG. 4 through FIG. 7 show the processes of a method of manufacturing the package on package substrate shown in FIG. 2.

Shown in FIG. 1 through FIG. 7 are a top package substrate 10, electronic elements 12 and 22, lines 13 and 23, molding parts 14 and 24, pads 15a, 25a, and 25b, solder resist layers 16a, 26a, and 26b, a bottom package substrate 20 and solders 31 and 32.

The present embodiment is related to a PoP substrate that can adjust the distance between package substrates and can form a fine pitch bump by forming a pad part having a two-layer structure and a solder resist layer having a two-layer structure on the bottom package substrate 20 and adhering the solder 31 to the pad having the two-layer structure.

The present embodiment is also related to a PoP substrate that can prevent an underfill solution, for example, from unnecessarily over-flowing, by arranging an upper layer of the solder resist layer having two-layer structure to envelop the electronic element in order to function as a dam.

The PoP substrate in accordance with the present embodiment can include the bottom package substrate 20 and the top package substrate 10, which is stacked on the bottom package substrate 20. The bottom package substrate 20 and the top package substrate 10 can be electrically connected to each other by the solder 31.

A pad part that is in contact with the solder 31 can be formed on an upper surface of the bottom package substrate 20 and a lower surface of the top sub package, respectively. In the present embodiment, a space can be provided between the top package substrate 10 and the bottom substrate package 20 by dividing the pad part into two layers and adjusting the thickness of the two-divided structure of the pad part. In other words, the PoP substrate can have the structure in which a first pad 25a is formed on a surface of the bottom package structure and a second pad 25b is formed on the formed first pad 25b.

In the case of the PoP substrate, the electronic elements 12 and 22 can be mounted on the top package substrate 10 and the bottom package substrate 20. The mounted electronic elements 12 and 22 can be electrically connected to the package substrates 10 and 20 by the lines 13 and 23. The electronic elements 12 and 22 can be fixed on the package substrates 10 and 20 by the molding part 14 and 24 after being mounted.

At least one electrical element 22 can be mounted on a predetermined position of an upper surface of the bottom package substrate 20. The height of the pad part that is formed on the upper surface of the bottom package substrate 20 can be adjusted such that the electronic element 22 mounted on the bottom package substrate 20 is accommodated in a space between the top and bottom package substrates 10 and 20.

In other words, the connection between the package substrates 10 and 20 in the PoP substrate can be made through the pad part formed on the upper surface of the bottom package substrate 20 through the solder 31 through the pad part formed on the lower surface of the top package substrate 10. In the present embodiment, it is possible to accommodate the electronic element 22 that is mounted on the bottom package substrate 20 in the space between the top and bottom package substrates 10 and 20.

Through such a structure, the electronic element 22 that is mounted on the bottom package substrate 20 can be accommodated in the space between the top and bottom package substrates 10 and 20. Moreover, it is possible to adjust the number of electronic elements 22 that can be mounted on the bottom package substrate 20 according to the thickness of the second pad. In other words, if a sufficient thickness of the second pad 25b is provided, it is possible to mount at least two electronic elements, which are vertically stacked, on the bottom package substrate 20.

On the other hand, the first solder resist layer 26a can be formed on the upper surface of the bottom package substrate 20, to allow the first pad 25a not to be covered corresponding to the first pad 25a, and the second solder resist layer 26b can be formed on the formed first solder resist layer 26a, to allow the second pad 25b to be exposed. The electric element 22 is placed on the first solder resist layer 26a as shown in FIG. 2. If the second solder resist layer 26b is formed on the upper surface of the first solder resist layer 26a in accordance with the present embodiment, the stepped part between the first solder resist layer 26a and the second solder resist layer 26b, which is the side part of the second solder resist layer 26b, may block the flowing of an underfill solution 24' or molding solution that is applied on a lower part of the electronic element 22.

As shown in FIG. 3, if the dam-shaped second solder resist layer 26b is separated by a predetermined distance and envelops the electronic element 22 mounted on the upper surface of the bottom package substrate 20, it is possible to more efficiently prevent the underfill solution 24' or the molding solution from overflowing.

Through the aforementioned structure, if the underfill process or molding process of the electronic element 22 mounted on the bottom package substrate 20 is performed, the second solder resist layer 26b can function as a dam, thereby preventing the underfill solution 24' or molding solution from unnecessarily over-flowing.

Moreover, if the second solder resist layer 26b and the second pad 25b are stepped (refer to reference numeral 26), the solder 31 that is mounted on the upper surface of the second pad 25b can be supported by the second solder resist layer 26b, thereby improving the stability of the structure.

On the other hand, both the solder resist layer and the pad part can be divided into two layers in accordance with an embodiment of the present invention. It is also possible to prevent the underfill solution from over-flowing, by maintaining the single structure of the pad part and dividing the solder resist layer into two layers as shown in FIG. 1.

Figure 4:
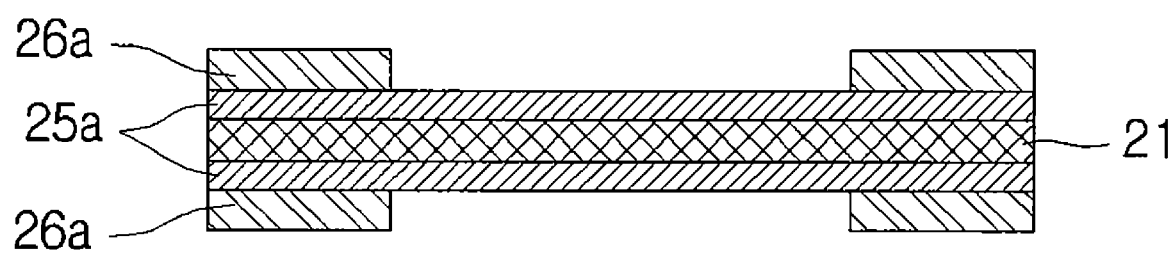
FIG. 4 through FIG. 7 show the processes of a method of manufacturing the package on package substrate shown in FIG. 2.
Figure 5:
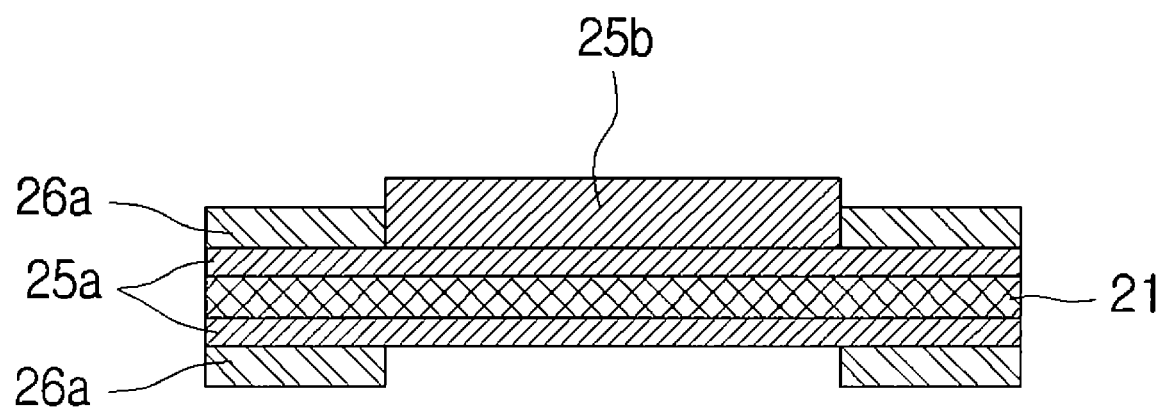
Figure 6:
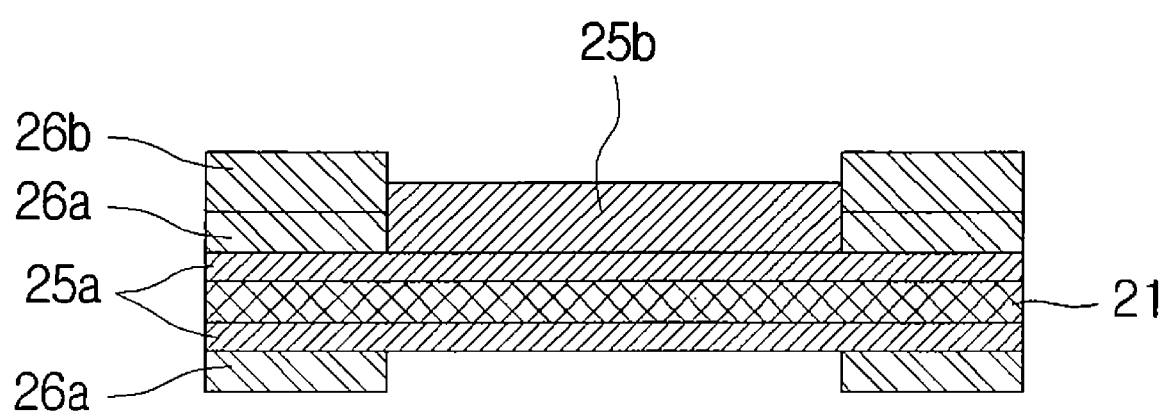
Figure 7:
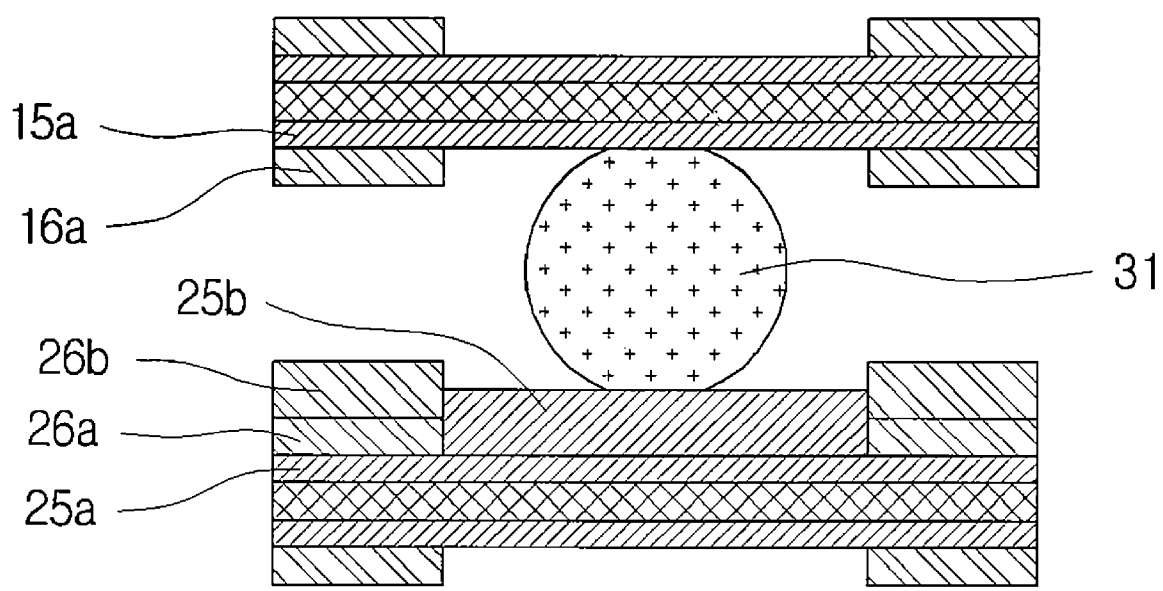

The following method can be used in order to manufacture the PoP substrate having the aforementioned structure. The first pad 25a can be selectively exposed by the first solder resist layer 26a, as shown in FIG. 4. Next, the second pad 25b can be formed on the first pad 25a by performing electroplating, as shown in FIG. 5, and then the second solder resist layer 26b can be formed on the first solder resist layer 26a, as shown in FIG. 6. Thereafter, the PoP substrate can be manufactured by interposing the solder 31 and stacking the top package substrate 10, as shown in FIG. 7.

The solder 31 can be adhered to the bottom package substrate 20 by mounting a ball-shaped solder, such as solder ball, on an upper surface of the substrate or by squeezing a solder paste on an upper surface of the substrate by using a metal mask and then removing the metal mask. The method of adhering the solder 31 to the upper surface of the substrate, however, may not be limited to the aforementioned method, and it shall be evident to those of ordinary skill in the art that various other methods can be used.

Figure 8:
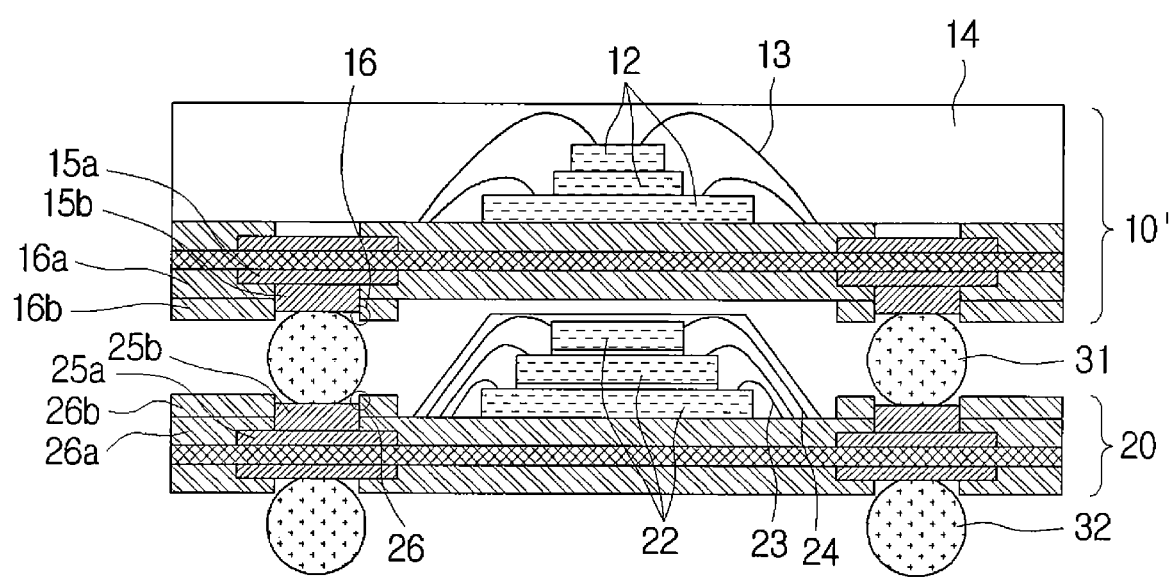
FIG. 8 is a cross-sectional view showing a package on package substrate in accordance with another embodiment of the present invention.

FIG. 8 is a cross-sectional view showing a package on package substrate in accordance with another embodiment of the present invention. As shown in FIG. 8, a pad part and a solder resist layer of the top package substrate 10' can also have the two-divided structure, as well as the pad part and the solder resist layer of the bottom package substrate 20.

In other words, a fourth pad 15b can be formed on a lower surface of a third pad 15a that has been formed on a lower surface of the top package substrate 10', and a fourth solder resist 16b can be formed on a lower surface of a third solder resist 15a that has been formed on a lower surface of the top package substrate 10'. Through the above structure, it is possible to provide a space between the top and bottom package substrates more easily by increasing the thickness of a pad that is formed on the top package substrate.

At this time, the fourth solder resist layer 16b and the fourth pad 15b can be stepped (refer to reference numeral 16). In this case, the solder 31 that is formed on the lower surface of the fourth pad 15b can be supported by the fourth solder resist layer 16b, thereby improving the stability of the structure.

Figure 9:
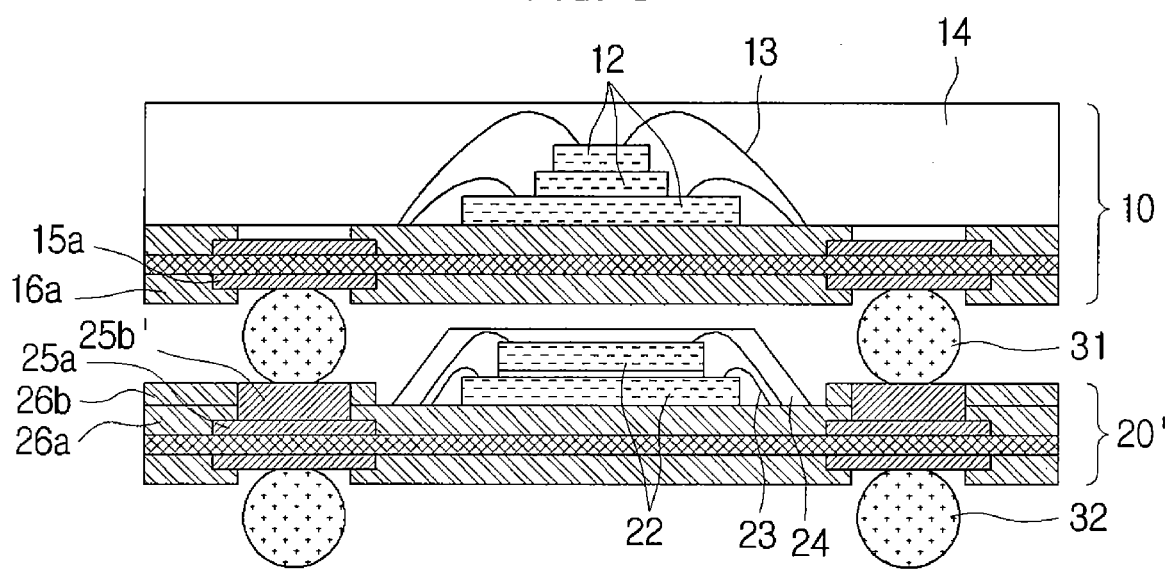
FIG. 9 is a cross-sectional view showing a package on package substrate in accordance with another embodiment of the present invention.

FIG. 9 is a cross-sectional view showing a package on package substrate in accordance with another embodiment of the present invention, and FIG. 10 through FIG. 13 show the processes of the method of manufacturing the package on package substrate shown in FIG. 9. As shown in FIG. 10 through FIG. 13, a pad part and a solder resist layer that are formed on a bottom package substrate 20' can have two-divided structures, but a second solder resist layer 26b and a second pad 25b' may not be stepped.

Figure 10:
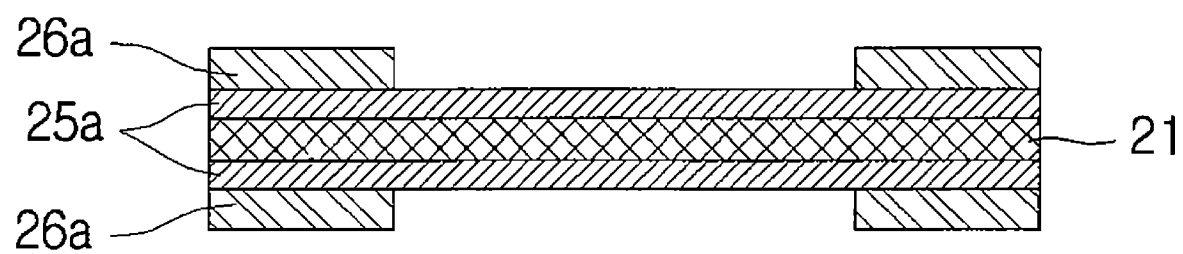
FIG. 10 through FIG. 13 show the processes of a method of manufacturing the package on package substrate shown in FIG. 9.
Figure 11:
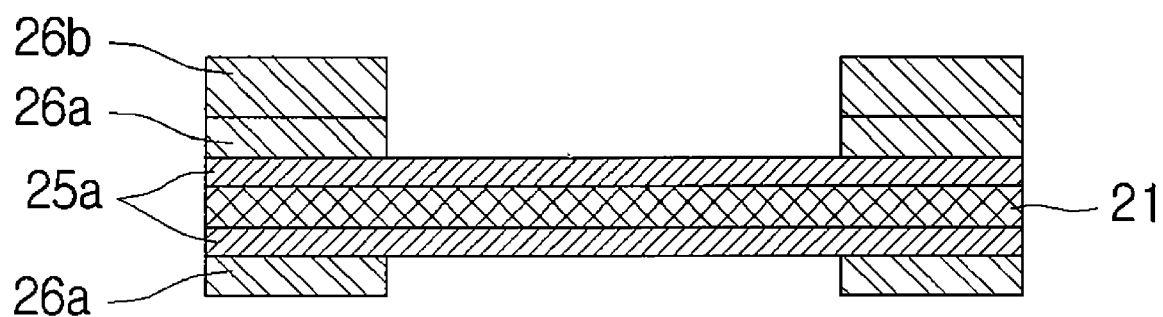
Figure 12:
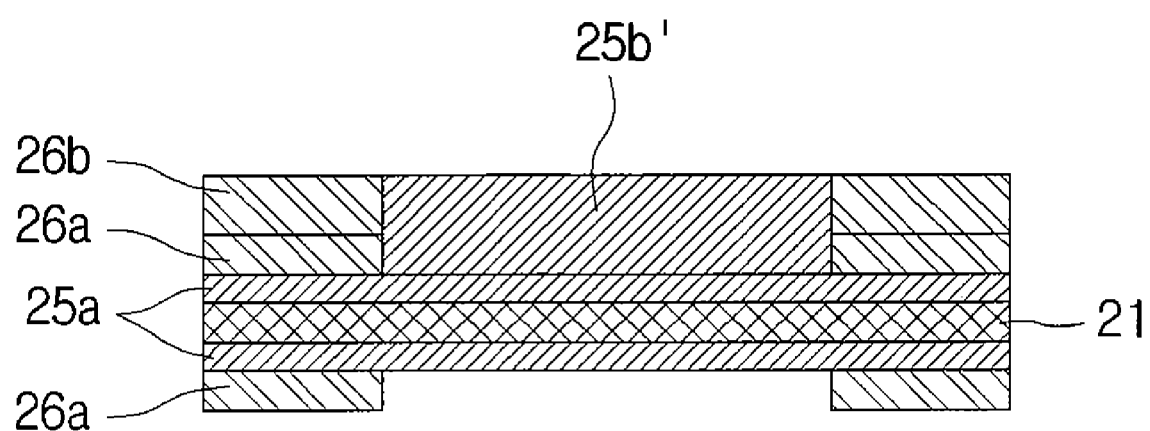
Figure 13:
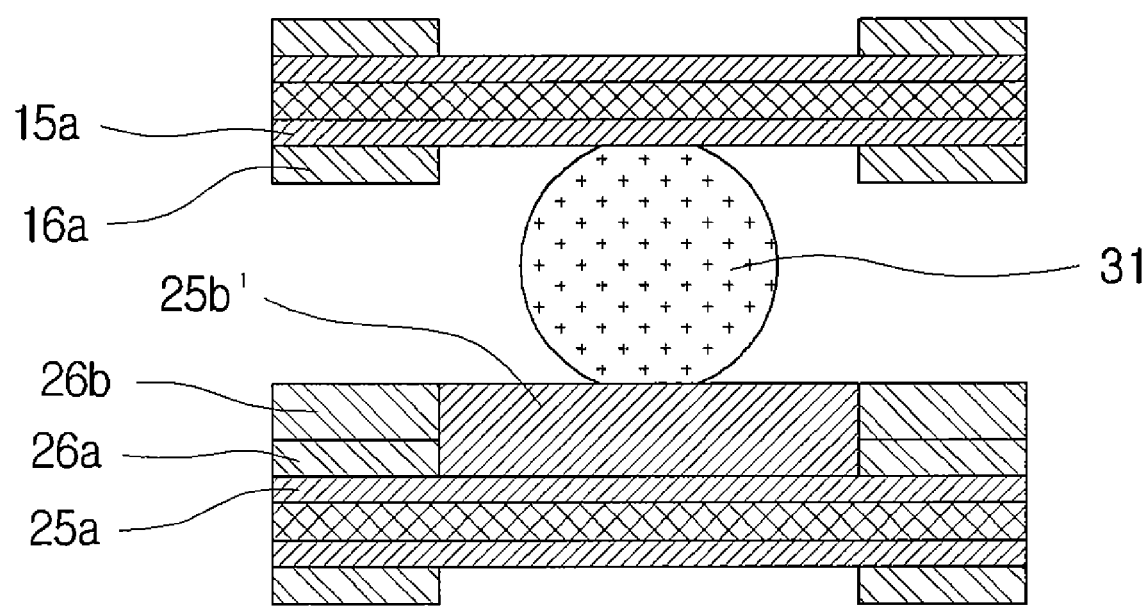

The following method can be used in order to manufacture the PoP substrate having the aforementioned structure. A first pad 25a can be selectively exposed by a first solder resist layer 26a, as shown in FIG. 10. Next, the solder resist layer 26b can be formed on the first solder resist layer 26a, as shown in FIG. 11, and then the second pad 25b' can be formed on the first pad 25a, as shown in FIG. 12. Thereafter, the PoP substrate can be manufactured by interposing the solder 31 and stacking the top package substrate 10, as shown in FIG. 13.

Like the bottom package substrate 20', it is possible to manufacture a PoP substrate having a structure in which a pad part and a solder resist layer of an upper package substrate have two-divided structure but the solder resist layer and the pad may be not stepped, although not illustrated.

Hitherto, although some embodiments of the present invention have been shown and described, it will be appreciated by any person of ordinary skill in the art that a large number of modifications, permutations and substitutions are possible within the principles and spirit of the invention, the scope of which shall be defined by the appended claims and their equivalents.

Many other embodiments can be included in the scope of claims of the present invention.

What is claimed is:

1. A package on package substrate, comprising:
    a bottom package substrate, an electronic element mounted on the bottom package substrate, a bottom pad part and a solder resist part corresponding to the bottom pad part being formed on an upper surface of the bottom package substrate; and
    a top package substrate being stacked on an upper side of the bottom package substrate by interposing a solder between the top package substrate and the bottom package substrate, a top pad part corresponding to the bottom pad part formed on a lower surface of the top package substrate,
    wherein the bottom pad part comprises a first pad formed on the upper surface of the bottom package substrate, and a second pad being formed on an upper surface of the first pad such that the second pad makes contact with the solder, and
    the solder resist part comprises a first solder resist layer being formed on the upper surface of the bottom package substrate corresponding to the first pad, and a second solder resist layer being shaped like a dam enveloping the electronic element and being formed on the first solder resist layer such that the second pad is exposed.

2. The package on package substrate of claim 1, wherein the second pad is formed by electroplating the first pad.

3. The package on package substrate of claim 1, wherein a stepped difference is formed between the second pad and the second solder resist layer.

4. The package on package substrate of claim 1, wherein the top pad part comprises:
    a third pad formed on the lower surface of the top package substrate;
    a fourth pad being formed on a lower surface of the third pad such that the fourth pad makes contact with the solder.

5. The package on package substrate of claim 4, further comprising:
- a third solder resist layer being formed on a surface of the top package substrate, corresponding to the third pad; and
- a fourth solder resist layer being formed on the third solder resist layer such that the fourth pad is exposed.

6. The package on package substrate of claim 5, wherein a stepped difference is formed between the fourth pad and the fourth solder resist layer.

7. The package on package substrate of claim 1, wherein a plurality of electronic elements are mounted, and the plurality of electronic elements are vertically stacked.

* * * * *